(12) United States Patent
Etschmaier

(10) Patent No.: US 10,175,270 B2
(45) Date of Patent: Jan. 8, 2019

(54) INTEGRATED CURRENT SENSOR SYSTEM AND METHOD FOR PRODUCING AN INTEGRATED CURRENT SENSOR SYSTEM

(71) Applicant: ams AG, Unterpremstaetten (AT)

(72) Inventor: Harald Etschmaier, Graz (AT)

(73) Assignee: ams AG, Unterpremstaetten (AT)

( * ) Notice: Subject to any disclaimer, the term of this patent is extended or adjusted under 35 U.S.C. 154(b) by 0 days.

(21) Appl. No.: 15/116,496

(22) PCT Filed: Jan. 16, 2015

(86) PCT No.: PCT/EP2015/050791
§ 371 (c)(1),
(2) Date: Aug. 3, 2016

(87) PCT Pub. No.: WO2015/117810
PCT Pub. Date: Aug. 13, 2015

(65) Prior Publication Data
US 2017/0010309 A1 Jan. 12, 2017

(30) Foreign Application Priority Data
Feb. 5, 2014 (EP) .................................. 14154008

(51) Int. Cl.
*G01R 15/20* (2006.01)
*G01R 33/00* (2006.01)
*G01R 19/00* (2006.01)

(52) U.S. Cl.
CPC ......... *G01R 15/202* (2013.01); *G01R 15/207* (2013.01); *G01R 33/0052* (2013.01)

(58) Field of Classification Search
CPC ......... G01R 15/20; G01R 33/00; G01R 19/00
See application file for complete search history.

(56) References Cited

U.S. PATENT DOCUMENTS 5,923,162 A 7/1999 Drafts et al.
6,380,727 B1 4/2002 Jitaru
(Continued)

FOREIGN PATENT DOCUMENTS

CN 102016606 A 4/2011
CN 102401851 A 4/2012
(Continued)

OTHER PUBLICATIONS

Zhao, L. et al., "Planar Embedded Pick-Up Coil Sensor for Integrated Power Electronic Modules", IEEE, Sep. 2004, pp. 945-951.

*Primary Examiner* — Huy Q Phan
*Assistant Examiner* — Zannatul Ferdous
(74) *Attorney, Agent, or Firm* — Fish & Richardson P.C.

(57) ABSTRACT

An integrated current sensor system has a printed circuit board with a magnetic field sensor with a sensor interface. The printed circuit board has a first side on which, isolated from the printed circuit board, a first current conductor is arranged with a longitudinal edge of a portion of the first current conductor being proximate to a sensitive area of sensor. The circuit board has a second side on which a second current conductor is, isolated from the printed circuit board, arranged, wherein a longitudinal edge of a portion of the second current conductor is arranged proximate to the sensitive area. The first and the second current conductor are electrically connected with at least one conductive via.

25 Claims, 4 Drawing Sheets

(56) References Cited

U.S. PATENT DOCUMENTS

| | | |
|---|---|---|
| 6,995,315 B2 | 2/2006 | Sharma et al. |
| 7,166,807 B2 | 1/2007 | Gagnon et al. |
| 8,400,139 B2 | 3/2013 | Ausserlechner |
| 2004/0124836 A1 | 7/2004 | Kang et al. |
| 2008/0297138 A1 | 12/2008 | Taylor et al. |
| 2011/0006763 A1* | 1/2011 | Bakker ........... G01R 15/202 324/251 |
| 2013/0008022 A1* | 1/2013 | Yao ................ G01R 33/09 29/830 |
| 2014/0176124 A1* | 6/2014 | Okumura ........ G01R 3/00 324/156 |
| 2015/0122532 A1* | 5/2015 | Nelson ........... H05K 3/4688 174/254 |
| 2016/0174386 A1* | 6/2016 | Sakoske .......... H05K 1/092 174/258 |

FOREIGN PATENT DOCUMENTS

| | | |
|---|---|---|
| CN | 102866279 A | 1/2013 |
| DE | 102006026148 A1 | 12/2007 |

\* cited by examiner

INTEGRATED CURRENT SENSOR SYSTEM AND METHOD FOR PRODUCING AN INTEGRATED CURRENT SENSOR SYSTEM

BACKGROUND OF THE INVENTION

The present disclosure relates to an integrated current sensor system, in particular for galvanically isolated current sensing, and to a method for producing such current sensor systems.

Current sensors are used for a variety of applications, for example current limitation, overcurrent protection or simply for monitoring the intensity of a current. For such applications magnetic field sensors like Hall sensors are widely used. Such magnetic field sensors sense the magnetic field generated by a current flowing through a current conductor and provide a measurement signal proportional to the intensity of the current. As the magnetic field decreases with increasing distance between the magnetic field sensor and the current conductor, it is tried to bring the magnetic field sensor close to the conductor carrying the current to be measured in order to have a sufficiently strong magnetic field.

In various implementations, leadframes of a sensor package are used as the current conductor. However, such implementations result in high costs with regard to the material and with regard to the production process. Additionally, the sensitivity of such current sensor implementations is limited due to inductive effects.

SUMMARY OF THE INVENTION

The present disclosure provides an improved concept for integrated current sensor systems that achieves an improved sensitivity and reduced production effort.

The improved concept is based on the idea that current conductors for generating the magnetic field to be sensed by the magnetic field sensor of an integrated current sensor system are not placed only on one side of the sensing area, for example above the sensing area, but also on the other side, hence below the magnetic field sensor. As a consequence, the magnetic field generated by the current conductors is higher than that generated with a single-sided solution, thus increasing the resulting signal of the magnetic field sensor. This effects in a higher sensitivity of the overall system. To achieve the double-sided implementation, the magnetic field sensor and preferably also the respective sensor interface are placed onto a printed circuit board, PCB, preferably are embedded in the printed circuit board. The two current conductors are placed on both sides of the printed circuit board and connected by means of conductive vias through the printed circuit board. The resulting structure of printed circuit board and current conductors can have the same form factor as a standard, surface mount integrated circuit package. Solderable leads may be integrated in the structure. Respective terminals for the current conductors are galvanically isolated from terminals for the sensor interface. The magnetic field sensor may be implemented as a Hall sensor.

According to an embodiment of the improved concept, an integrated current sensor system comprises a printed circuit board with a magnetic field sensor and with a sensor interface being coupled to the sensor. The printed circuit board has a first main surface defining a first side, and a second main surface being opposite to the first main surface and defining a second side. A first current conductor is, isolated from the printed circuit board, arranged on the first side in a plane being parallel to the printed circuit board and connected to a first current terminal. A longitudinal edge of a portion of the first current conductor is arranged proximate to a sensitive area of the sensor. In a similar fashion, a second current conductor is, isolated from the printed circuit board, arranged on the second side on a plane being parallel to the printed circuit board and connected to a second current terminal. A longitudinal edge of the portion of the second current conductor is also arranged proximate to the sensitive area of the sensor. The first and the second current conductor are electrically connected by means of at least one conductive via through the printed circuit board, such that a current path is formed between the first current terminal and the second current terminal. For example, the current to be measured is provided to the current sensor system through the first and the second current terminal. The at least one conductive via may be implemented as a plated through hole, PTH, through the printed circuit board.

The improved concept may be implemented with the sensor interface for operating and evaluating the magnetic field sensor and with the magnetic field sensor being integrated on a single semiconductor die, for example made of silicon. In other implementations, two separate dies are provided for the sensor interface and the magnetic field sensor, which may be separately placed on the printed circuit board. In the various implementations the magnetic field sensor may be implemented as one or more Hall sensors. In an example implementation the magnetic field sensor is implemented as a Hall sensor element fabricated in GaAs technology on a single die, wherein the sensor interface may be implemented on a single silicon die.

In some implementations, the current conductors are formed in a flat fashion with a thickness of only a few hundred micrometers, the flat portion being basically parallel to the printed circuit board. Hence, a low overall package height can be achieved for the current sensor system.

In some implementations, the first current conductor, the at least one conductive via and the second current conductor form a coil with at least one winding. That is to say, the overall current path crosses itself, looking from above the active area of the magnetic field sensor.

For example, assuming a rectangular shape of the active area of the magnetic field sensor, the first and/or the second current conductor can be formed such that the longitudinal edge of the current conductor is proximate to three of four sides of the active area. The coil-like structure allows for increasing the length of the longitudinal portions being proximate to the active area such that the intensity of the magnetic field generated by the current conductors in the active area is increased. Consequently, a higher field strength can be achieved through the current loop.

More generally speaking, in various implementations the longitudinal edge of the portion of the first current conductor and/or the second current conductor extends at least partially around the sensitive area of the sensor in a bent fashion.

Preferably the magnetic field sensor may be mainly sensitive to a magnetic field being perpendicular to the printed circuit board or to the planes, on which the portions of the first and second current conductor are arranged.

The first and the second current conductor may each be formed from a metallic foil, for example a copper foil, that is stacked on the first, respectively second, side of the printed circuit board. The foil may implement a respective metallic layer, which is stacked on each side of the printed circuit board. Preferably, a layer of pre-impregnated composite fibers is stacked on each side of the printed circuit board between the printed circuit board and the metallic layer, respectively the current conductors. Such an intermediate layer may ensure a predefined distance between the first and the second current conductor and/or between the current conductors and the electrical components of the printed circuit board to achieve a desired breakdown voltage. The metallic foil may have a thickness between 100 μm and 300 μm, in particular around 200 μm.

In some embodiments the sensor is embedded, or the sensor and the sensor interface are embedded respectively, in the printed circuit board such that an electrical isolation is achieved towards the first main surface and the second main surface. Such embedding may be achieved by a standard semi-additive embedding process.

In some embodiments, a shielding layer against electromagnetic interference, EMI, is integrated within the printed circuit board. For example, a double-sided EMI shielding can be implemented.

In some implementations the sensor interface comprises an application-specific integrated circuit, ASIC. Interface terminals being connected to the sensor interface may be provided in the system. Such interface terminals and/or the first and the second current terminal may be formed respectively by plated through holes being intersected when the system is singularized. For example, during production, respective plated through holes may be provided at the future edges of the printed circuit board which are cut through in one of the final production steps.

A method for producing an integrated current sensor system according to the improved concept comprises providing a magnetic field sensor and a sensor interface to be coupled to the sensor. The sensor and the sensor interface are wired. With or after the wiring step, the sensor is embedded or the sensor and the sensor interface respectively are embedded in the printed circuit board. Preferably by the embedding process an electrical isolation is achieved towards a first main surface of the printed circuit board and a second main surface of the printed circuit board being opposite to the first main surface. A first metallic foil, for example a copper foil, is stacked onto a first side of the printed circuit board defined by the first main surface. A second metallic foil, preferably of the same material as the first metallic foil, is stacked onto a second side of the printed circuit board defined by the second main surface. In a subtractive process, a first current conductor is formed from the first metallic foil, wherein the forming is performed inter alia such that a longitudinal edge of a portion of the first current conductor is arranged proximate to a sensitive area of the sensor. Additionally, also in a subtractive process, a second current conductor is formed from the second metallic foil. Also in this case the forming is performed inter alia such that a longitudinal edge of a portion of the second current conductor is arranged proximate to the sensitive area of the sensor. At least one conductive via is produced through the printed circuit board, for example implemented as a PTH. An electrical connection is established between the first current conductor and the second current conductor by means of the at least one conductive via.

In some implementations, before stacking the first and second metallic foil respectively, a respective layer of pre-impregnated composite fibers is stacked onto the first side of the printed circuit board and the second side of the printed circuit board. For example, such an intermediate composite fiber layer may be directly stacked on each side of the embedded printed circuit board, and the respective metallic foil layers are directly stacked onto the respective intermediate layers.

With the embodiments of the production method according to the improved concept, a low overall package height at high voltages can be achieved, for example due to high dielectric strength of the PCB technology.

The method according to the improved concept may further comprise producing a first current terminal being connected to the first current conductor and producing a second current terminal being connected to the second current conductor, such that a current path is formed between the first current terminal and the second current terminal.

As described in more detail for the various embodiments of the current sensor system above, the production method may be embodied such that the first current conductor, the at least one conductive via and the second current conductor form a coil with at least one winding. As mentioned before, the at least one conductive via may be implemented by one or more plated through holes.

Further implementations of the production method become easily apparent from the description of the various embodiments of the integrated current sensor system given above.

BRIEF DESCRIPTION OF THE DRAWINGS

The text below explains the improved concept in detail using exemplary embodiments with reference to the drawings. Same references are used for same elements or circuit parts, or elements or circuit parts having similar functions in the various figures. Hence, the description of elements or circuit parts in one figure is not repeated in the following figures. In the drawings.

DETAILED DESCRIPTION

Figure 1A:
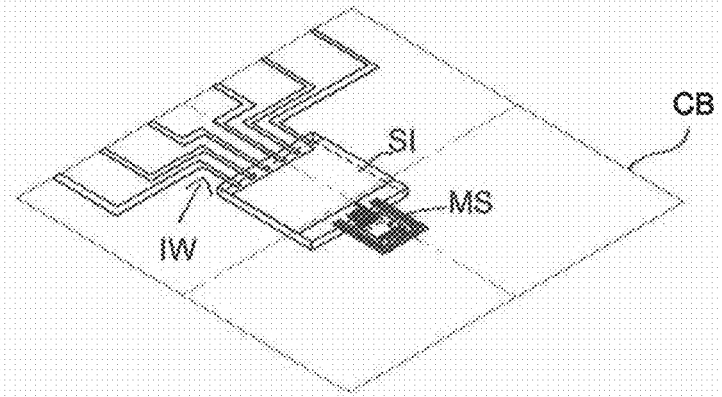
FIGS. 1A and 1B show schematic views of a printed circuit board during production of an integrated current sensor system according to the improved concept.
Figure 1B:
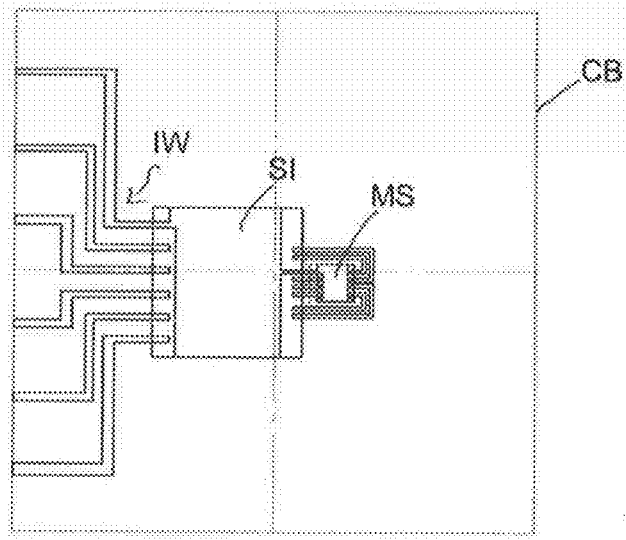

FIGS. 1A and 1B show a printed circuit board, PCB, CB in detail, respectively an intermediate production step of an integrated current sensor system according to the improved concept. On the circuit board CB a magnetic field sensor MS and a corresponding sensor interface SI connected to the magnetic field sensor MS are integrated. Respective interface wires IW for connecting the sensor interface SI are further integrated on the circuit board CB.

In the embodiment shown, the magnetic field sensor MS and the sensor interface SI are provided as two separate dies. However, in alternative implementations the sensor interface SI and the magnetic field sensor MS may be provided as a single die. The magnetic field sensor may be a Hall sensor, which preferably is fabricated in GaAs technology, allowing a high sensitivity of the Hall sensor. The sensor interface SI may be implemented as an application-specific integrated circuit, ASIC, which may be made of silicon. The magnetic field sensor MS is sensitive to a magnetic field perpendicular to the active area, respectively the main surfaces of the circuit board CB.

Figure 2:
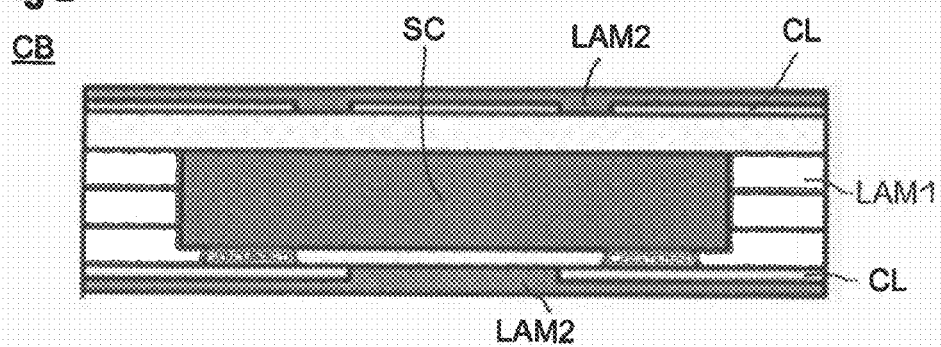
FIG. 2 shows a detail of an embedded circuit board in a cut view.

When producing the integrated current sensor system, in a following step the printed circuit board CB may undergo an embedding process in which the die or the dies containing the sensor interface SI and the magnetic field sensor MS are wired in a standard embedding process with a multilayer PCB, for example a two-layer PCB. This process preferably is performed semi-additive FIG. 2 shows a detail of such an embedded circuit board CB in a sectional view. A respective chip SC is laminated within a group of first laminating layers LAM1, conducting layers CL in a group of second laminating layers LAM2, wherein the chip SC may be the sensor interface SI and/or the magnetic field sensor MS. On the two conducting layers CL also an EMI shielding may be integrated, which in principle consists of a metal plate over the sensor MS and the sensor interface SI, the metal plate being connected to ground.

With such a structure, the dies for the magnetic field sensor MS and the sensor interface SI are isolated towards the main surfaces above and below the second laminate layers LAM2.

Figure 3A:
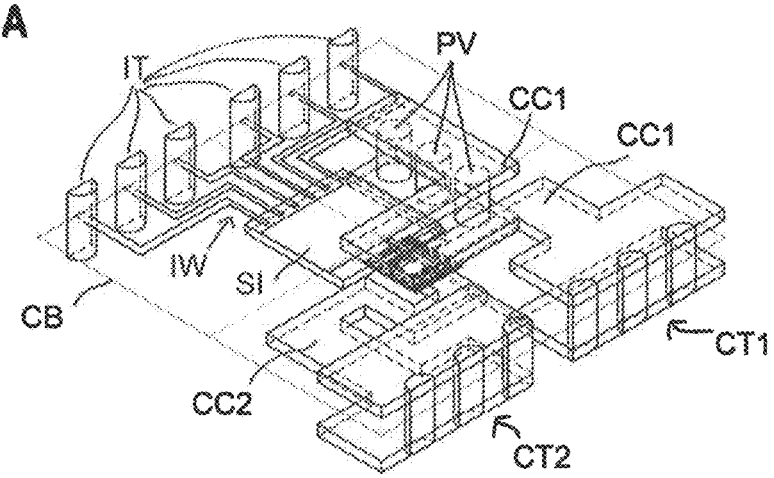
FIGS. 3A, 3B and 3C show different views of an embodiment of an integrated current sensor system according to the improved concept.
Figure 3B:
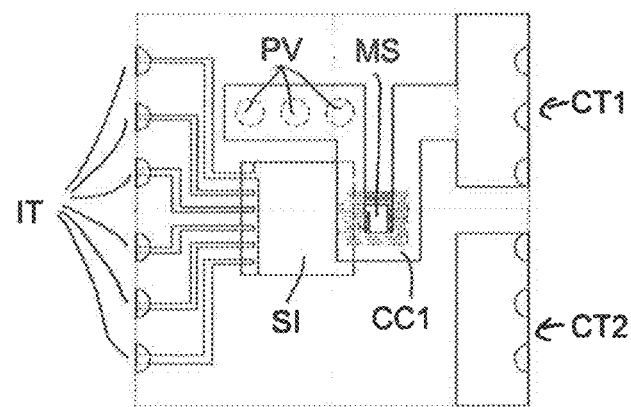

In order to achieve the integrated current sensor system according to the improved concept, respective current conductors are provided below and above the circuit board CB, which is shown in more detail in FIGS. 3A, 3B and 3C. FIG. 3A shows a perspective view of a schematic arrangement of the integrated current sensor system with a first current conductor CC1 above the circuit board CB and a second current conductor CC2 below the circuit board CB. FIG. 3B shows a detailed top view comprising the first current conductor CC1, while FIG. 3C shows a top view of the system with the second current conductor CC2.

The first current conductor CC1 is connected to a first current terminal CT1, and the second current conductor CC2 is connected to a second current terminal CT2. In this embodiment, the current terminals CT1, CT2 are formed by plated through holes which are cut through or intersected during singularizing the sensor system. Respective conductive vias PV are provided through the circuit board CB which establish a contact between the first current conductor CC1 and the second current conductor CC2. The interface wires IW of the sensor interface SI are connected to respective interface terminals IT, which in this embodiment, similarly to the current terminal CT1, CT2, are formed by intersected plated through holes.

As can be seen from FIGS. 3A and 3B, the first current conductor CC1 is conducted around the side edges of an active area of the magnetic field sensor MS. Hence, a current through the current conductor CC1 generates a magnetic field along the longitudinal edge of the current conductor CC1. This magnetic field can be sensed by the sensor MS.

Figure 3C:
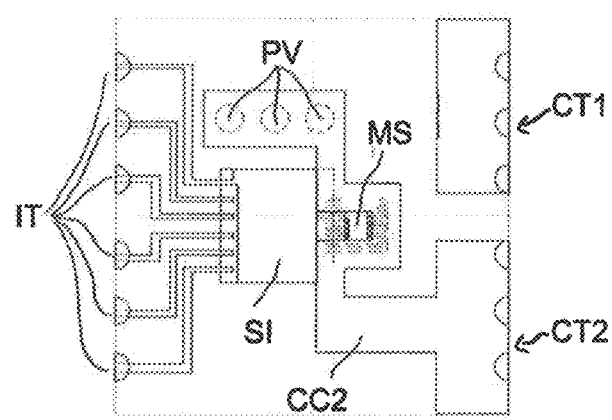

In a similar fashion, FIGS. 3A and 3C show that the second current conductor CC2 is conducted or bent around the magnetic field sensor MS on the other side of the circuit board CB. Hence, also the current through the second current conductor CC2 generates a respective electromagnetic field through the active area of the sensor MS. The first and the second current conductors CC1, CC2 are arranged and connected such that the magnetic field generated has the same direction through the active area and is therefore added. As a consequence, a higher magnetic field strength can be achieved with the double-sided application of the current conductors CC1, CC2. It should be noted that a common path of the first and the second current conductor CC1, CC2 crosses itself in the top view as shown in FIGS. 3B and 3C and therefore a coil with at least one winding is formed.

Figure 4:
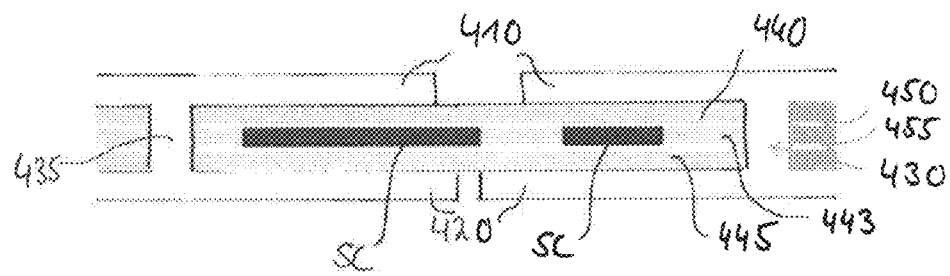
FIG. 4 shows an exemplary cut view of an embodiment of an integrated current sensor system.

FIGS. 3A, 3B and 3C do not show any laminated layers between the current conductor layers and the circuit board, respectively the sensor interface SI and the sensor MS, for a better overview, FIG. 4 shows a sectional view of a detail of the integrated current sensor system in which the different layers of the system can be seen. For example, the layers 410, 420 correspond to the layers in which the current conductors CC1, CC2 are formed and which are interconnected by means of the conductive vias 430, 435. The dies SC containing the sensor interface SI and the sensor MS are embedded in the two-layer PCB structure formed by laminate layers 440, 443 and 445, which are separated by respective conductive layers 450 and 455 that, for example, are made of copper. The thin copper layers 450, 455 are used for wiring of the sensor, respectively the sensor interface, and for providing the EMI shielding mentioned before. The thicker conductive layers 410, 420, in which the current conductors CC1, CC2 are formed, may also be made of copper having a thickness in the range of a few hundred micrometers. For example, a thickness of the current conductors is in the range of between 100 µm and 300 µm, particularly around 200 µm. The laminate layers have a thickness which is adapted to a desired breakthrough voltage of the system, allowing a safe operation.

Figure 5:
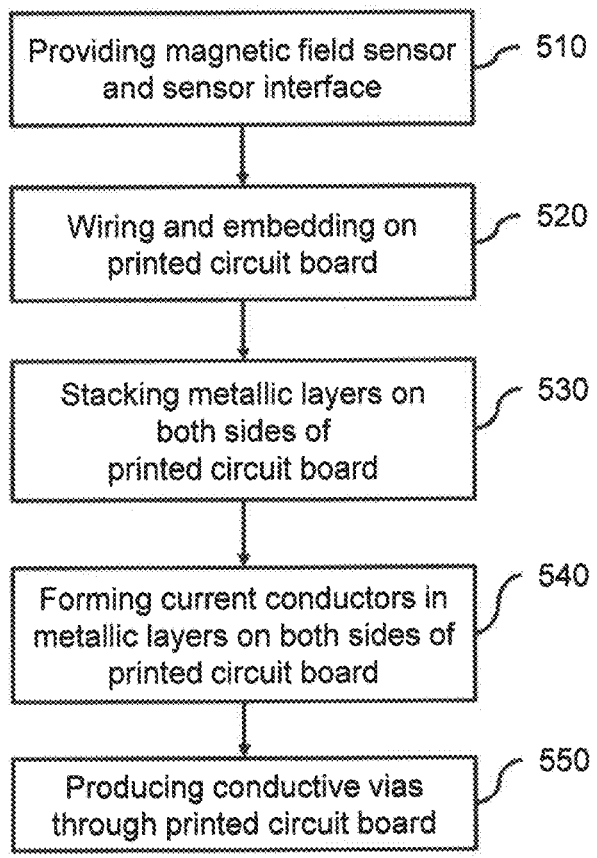
FIG. 5 shows a flowchart of an embodiment of a method for producing an integrated current sensor system according to the improved concept.
Figure 6A:
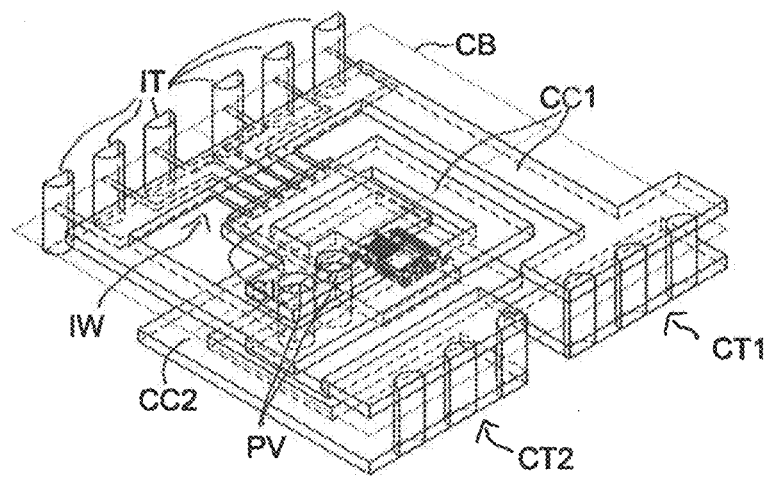
FIG. 6A, 6B, 6C show different views of a further embodiment of an integrated current sensor system according to the improved concept.
Figure 6B:
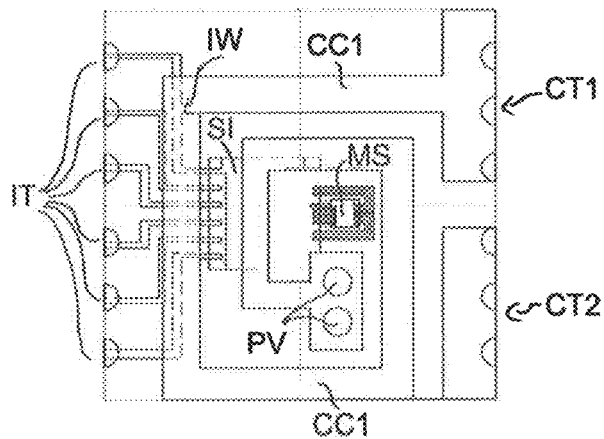
Figure 6C:
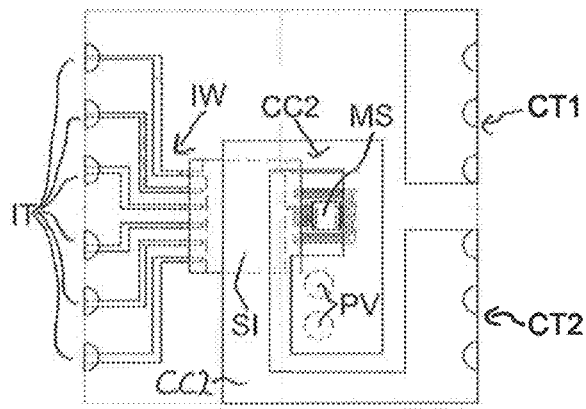

FIG. 5 shows an exemplary flowchart of a method for producing an integrated current sensor system as, for example, shown in the previous figures or in FIGS. 6A, 6B and 6C.

In block 510 a magnetic field sensor and a sensor interface are provided, either on a common semiconductor die or on two separate dies, as described above.

In block 520 the single die, or the two separate dies, are wired and embedded on a printed circuit board, for example in a semi-additive process in order to achieve a multi-layer, in particular a two-layer printed circuit board.

In block 530 metallic layers are stacked on both sides of the printed circuit board, which for example have the desired thickness for the current conductors 51, 52 to be formed in block 540. There the current conductors are formed preferably by a subtractive process, during which the current conductors CC1, CC2 and potential further structures in connection with the current terminals remain over.

In the following block 550 conductive vias are produced extending through the printed circuit board. These conductive vias may be made as plated through holes that may function as interface terminals IT, current terminals CT1, CT2 and/or for the electrical connection of the first and the second current conductor CC1, CC2 through the printed circuit board CB.

The resulting structure may be singularized and packaged in any standard IC package known in the art.

It should be noted that the intermediate laminate layers between the current conductors CC1, CC2 and the printed circuit board CB may be formed from a respective layer of pre-impregnated composite fibers stacked on top and bottom of the PCB core. The metallic layer, which may be formed of a copper foil, may be cured together with the layer of composite fibers under pressure and heat. It should be further noted that the process of producing conductive vias may at least partially be performed before stacking the metallic layers and/or stacking the intermediate laminate layers.

FIGS. 6A, 6B and 6C show different views of a further embodiment of an integrated current sensor system according to the improved concept which is based on the embodiment shown in FIGS. 3A, 3B and 3C, but has a different guidance of the current conductors CC1, CC2.

In particular, FIG. 6A shows a perspective view, whereas FIG. 6B shows a top view with the first current conductor CC1 and FIG. 6C shows a top view with the second current conductor CC2.

As can be seen best from FIG. 6B, the first current conductor CC1 has about two windings around the magnetic field sensor MS, therefore increasing the magnetic field strength generated by a respective current. In a similar fashion the second current conductor CC2 also has more than one full winding around the magnetic field sensor MS, which can be best seen in FIG. 6C. As in the previous embodiments, the first and the second current conductor CC1, CC2 are electrically connected by the conductive vias PV. Consequently, the arrangement of FIGS. 6A, 6B, 6C forms a coil with more than one winding by means of the current conductor CC1, CC2. Furthermore, the current conductors CC1, CC2 bend around the active area of the magnetic field sensor MS.

In the various embodiments of the integrated current sensor systems as described above, integrated solenoids can be achieved forming respective current loops. Such a current loop achieves a better sensitivity of the overall system. Furthermore, the better sensitivity is supported by the low achievable distance between the current conductors and the magnetic field sensor. With the embedding technology used for the circuit board CB, the integration of one-sided or double-sided EMI shielding can be achieved with little effort. A low overall package height at high voltages due to high dielectric strength of the PCB technology can be achieved.

The invention claimed is:

1. An integrated current sensor system, comprising:
a printed circuit board with a magnetic field sensor and with a sensor interface being coupled to the sensor, the printed circuit board having a first main surface defining a first side, and a second main surface being opposite to the first main surface and defining a second side;
a first current conductor, which is, isolated from the printed circuit board, arranged on the first side in a plane being parallel to the printed circuit board and connected to a first current terminal, wherein a longitudinal edge of a portion of the first current conductor is arranged proximate to a sensitive area of the sensor; and
a second current conductor which is, isolated from the printed circuit board, arranged on the second side in a plane being parallel to the printed circuit board and connected to a second current terminal, wherein a longitudinal edge of a portion of the second current conductor is arranged proximate to the sensitive area of the sensor,
wherein the first current conductor and the second current conductor are electrically connected with at least one conductive via through the printed circuit board, the at least one conductive via forming a current path between the first current conductor and the second current conductor, and
wherein the first current conductor connects the first current terminal to the at least one conductive via and the second current conductor connects the second current terminal to the at least one conductive via.

2. The system according to claim 1, wherein the first current conductor, the at least one conductive via and the second current conductor form a coil with at least one winding.

3. The system according to claim 1, wherein the longitudinal edge of the portion of the first current conductor and/or the second current conductor extends at least partially around the sensitive area of the sensor in a bent fashion.

4. The system according to claim 1, wherein the magnetic field sensor is implemented with at least one Hall sensor.

5. The system according to claim 1, wherein the magnetic field sensor has a main sensitivity to a magnetic field perpendicular to the printed circuit board.

6. The system according to claim 1, wherein the magnetic field sensor is implemented with at least one Hall sensor having a main sensitivity to a magnetic field perpendicular to the printed circuit board.

7. The system according to claim 1, wherein the first current conductor and the second current conductor are each formed from a metallic foil, in particular copper foil, that is stacked on the first respectively second side of the printed circuit board and that has a thickness between 100 µm and 300 µm, in particular around 200 µm.

8. The system according to claim 1, wherein the sensor is embedded or the sensor and the sensor interface are embedded respectively in the printed circuit board such that an electrical isolation is achieved towards the first main surface and the second main surface.

9. The system according to claim 1, wherein a shielding layer against electromagnetic interference, EMI, is integrated within the printed circuit board.

10. The system according to claim 1, wherein the sensor interface comprises an application specific integrated circuit, ASIC.

11. The system according to claim 1, further comprising interface terminals being connected to the sensor interface.

12. The system according to claim 1, wherein the first current terminal and the second current terminal and/or interface terminals being connected to the sensor interface are formed by a plated through hole, PTH, being intersected when the system is singularized.

13. A method for producing an integrated current sensor system, the method comprising:
providing an magnetic field sensor and a sensor interface to be coupled to the sensor;
wiring the sensor and the sensor interface and embedding the sensor or embedding the sensor and the sensor interface respectively in a printed circuit board such that an electrical isolation is achieved towards a first main surface of the printed circuit board and a second main surface of the printed circuit board being opposite to the first main surface;
stacking a first metallic foil, in particular copper foil, onto a first side of the printed circuit board defined by the first main surface;
stacking a second metallic foil, in particular copper foil, onto a second side of the printed circuit board defined by the second main surface;
forming, in a subtractive process, a first current conductor from the first metallic foil, such that a longitudinal edge of a portion of the first current conductor is arranged proximate to a sensitive area of the sensor;
forming, in a subtractive process, a second current conductor from the second metallic foil, such that a longitudinal edge of a portion of the second current conductor is arranged proximate to the sensitive area of the sensor;

producing at least one conductive via through the printed circuit board; and electrically connecting the first current conductor and the second current conductor with the at least one conductive via.

14. The method according to claim 13, wherein, before stacking the first and second metallic foil respectively, a respective layer of pre-impregnated composite fibres is stacked onto the first side of the printed circuit board and the second side of the printed circuit board.

15. The method according to claim 13, further comprising:

producing a first current terminal being connected to the first current conductor; and producing a second current terminal being connected to the second current conductor, such that a current path is formed between the first current terminal and the second current terminal.

16. The method according to claim 13, wherein the first current conductor, the at least one conductive via and the second current conductor form a coil with at least one winding.

17. The method according to claim 13, wherein the magnetic field sensor is implemented with at least one Hall sensor.

18. The method according to claim 13, wherein the magnetic field sensor has a main sensitivity to a magnetic field perpendicular to the printed circuit board.

19. The method according to claim 13, wherein the magnetic field sensor is implemented with at least one Hall sensor having a main sensitivity to a magnetic field perpendicular to the printed circuit board.

20. The method according to claim 13, wherein the longitudinal edge of the portion of the first current conductor and/or the second current conductor extends at least partially around the sensitive area of the sensor in a bent fashion.

21. The method according to claim 13, wherein the embedding is performed in a semi-additive process.

22. The system according to claim 1, wherein the magnetic field sensor senses a magnetic field by a current from the first current terminal to the second current terminal via the first current conductor and the second current conductor and the at least one conductive via.

23. The system according to claim 1, wherein the system is configured to provide a measurement signal proportional to a current between the first current terminal and the second current terminal.

24. The system according to claim 1, wherein the first and the second current terminals are external terminals of the integrated current sensor system.

25. The system according to claim 1, wherein the current terminals are accessible from outside a package of the integrated current sensor system.

* * * * *